United States Patent

Pan

[11] Patent Number: 6,150,189
[45] Date of Patent: Nov. 21, 2000

[54] METHOD FOR FORMING A PHOTO DIODE AND A CMOS TRANSISTOR SIMULTANEOUSLY

[75] Inventor: Jui-Hsiang Pan, Hsin-Chu, Taiwan

[73] Assignee: United Microelectronics Corp., Hsin-chu, Taiwan

[21] Appl. No.: 09/391,358

[22] Filed: Sep. 8, 1999

[51] Int. Cl.[7] .................................................. H01L 21/00
[52] U.S. Cl. ................................ 438/59; 438/57; 438/48
[58] Field of Search ................................ 438/48, 57, 23, 438/59, 200; 257/292, 291

[56] References Cited

U.S. PATENT DOCUMENTS

| | | | |
|---|---|---|---|
| 4,611,223 | 9/1986 | Hine et al. | 357/30 |
| 5,841,159 | 11/1998 | Lee et al. | 257/291 |
| 5,880,495 | 3/1999 | Chen | 257/233 |
| 6,033,232 | 3/2000 | Lin et al. | 437/237 |
| 6,040,593 | 3/2000 | Park | 257/292 |

Primary Examiner—Richard Elms
Assistant Examiner—Bradley K Smith
Attorney, Agent, or Firm—Winston Hsu

[57] ABSTRACT

This invention provides a method of simultaneously forming a photo diode and a CMOS transistor on a semiconductor wafer. The semiconductor wafer comprises a P-type substrate. The surface of the P-type substrate comprises at least one N-channel MOS area for forming an NMOS transistor of the CMOS transistor, a P-channel MOS area for forming a PMOS transistor of the CMOS transistor, and a photo sensing area for forming a photo diode. The method comprises an ion implantation process to form a P-type well in the NMOS area, and an ion implantation process to form a N-type doped area in a predetermined area on the surface of the photo sensing area and also to form a N-type well of the PMOS transistor in the PMOS area. The dopants in the N-type doped area will interact with the neighboring P-type substrate to form a depletion region which fills the P-type substrate within the photo sensing area but outside the predetermined area. Thus, the surface of the photo sensing area is completely covered by the N-type doped area and the depletion region.

8 Claims, 3 Drawing Sheets

METHOD FOR FORMING A PHOTO DIODE AND A CMOS TRANSISTOR SIMULTANEOUSLY

BACKGROUND OF THE INVENTION

1. Field of the Invention

The present invention relates to a method for forming a photo diode on a semiconductor wafer, and more particularly, to a method for simultaneously forming a photo diode and a CMOS transistor on a semiconductor wafer.

2. Description of the Prior Art

The photo diode is a semiconductor device comprising a photo-conductivity cell and a junction diode, and is commonly applied to manufacture photoelectric products, such as cameras and photo sensors of scanners. The light current of the photo diode represents signals, the dark current represents noises, and the photo diode processes signal data by using the intensity of the signal to noise ratio. In the semiconductor industry, it is often to increase the light current of the photo diode so as to increase the signal to noise ratio, and hence to enhance the contrast of the signal. As a result, the sensitivity of the photo diode is enhanced and the quality of the photo diode is improved.

Please refer to FIG. 1, FIG. 1 is a schematic diagram of a photo diode 17 according to the prior art. A semiconductor wafer 10 comprises a substrate 14, a P-type well 16 positioned on the substrate 14, a NMOS transistor 11 and a photo sensing area 12 formed on the P-type well 16, and a field oxide 18 positioned on the substrate 14 and surrounding the NMOS transistor 11 and the photo sensing area 12. The field oxide 18 forms a electrical isolation to prevent short circuits.

The method for forming the photo diode 17 according to the prior art uses arsenic (As) atoms at a high dosage as the dopant to proceed an ion implantation process. The energy and the dosage for the ion implantation process is 80 KeV and $10^{15}$ cm$^{-2}$, respectively. The ion implantation process forms a N-type doped area 13 on the surface of the P-type well 16. A depletion region 15 for detecting the light current is formed across the PN junction between the doped area 13 and the adjacent P-type well 16.

In the formation of the photo diode 17 according to the prior art, As atoms at high dosage for forming the source and the drain of the MOS transistor are used as the major dopant to simultaneously form the doped area 13 on the surface of the P-type well 16. The crystal structure on the surface of the photo sensing area 12 may be damaged during the ion implantation with high dosage ions. Thus, in the PN junction of the photo diode 17 more dark current is generated, resulting in more noises for the photo diode 17. Also, the doped area 13, which is formed by the ion implantation with high dosage ions, has a depletion region 15 with a narrow width, leading to a decrease in the real active region of the sensing area 12. Therefore, when the photo diode 17 is irradiated by lights, the light current sensed by the depletion region 15 is reduced and the signal to noise ratio is lowered. And hence, the sensitivity of the photo diode 17 is reduced.

In addition, the higher implantation energy also causes a deeper PN junction depth. When the photo diode 17 is irradiated by short wavelength lights, the blue light for instance, the light current induced by the PN junction of the photo diode 17 becomes smaller, because the short wavelength light has a shallow penetration depth in the silicon wafer. Consequently, the sensitivity of the photo diode 17 for detecting short wavelength lights is reduced.

SUMMARY OF THE INVENTION

It is therefore a primary objective of the present invention to provide a method for forming a photo diode to enhance the sensitivity of the photo diode, and for forming a photo diode and a CMOS transistor simultaneously to simplify the fabrication processes and reduce the processing cost.

In a preferred embodiment, the present invention provides a method for forming a photo diode and a CMOS transistor on a semiconductor wafer simultaneously. The semiconductor wafer comprising a P-type substrate on its surface, and the surface of the P-type substrate comprises at least one N-channel MOS area for forming an NMOS transistor of the CMOS transistor, a P-channel MOS area for forming a PMOS transistor of the CMOS transistor, and a photo sensing area for forming a photo diode, the method comprising the following steps:

performing a first ion implantation process to form a P-type well of the NMOS transistor in the NMOS area; and performing a second ion implantation process to form a first N-type doped area in at least one predetermined area on the surface of the photo sensing area and also to form a N-type well of the PMOS transistor in the PMOS area;

wherein the dopants in the first N-type doped area interact with the neighboring P-type substrate to form a depletion region which fills the P-type substrate within the photo sensing area but outside the predetermined area so that the surface of the photo sensing area is completely covered by the first N-type doped area and the depletion region.

It is an advantage of the present invention that the surface of the photo sensing area is completely covered by the N-type doped area and the depletion region to enhance the sensitivity of the photo diode for detecting the short wavelength light, and prevent the damages of the crystal structure on the surface of the photo sensing area.

These and other objectives of the present invention will no doubt become obvious to those of ordinary skill in the art after reading the following detailed description of the preferred embodiment which is illustrated in the various figures and drawings.

DETAILED DESCRIPTION OF THE PREFERRED EMBODIMENT

Figure 1:
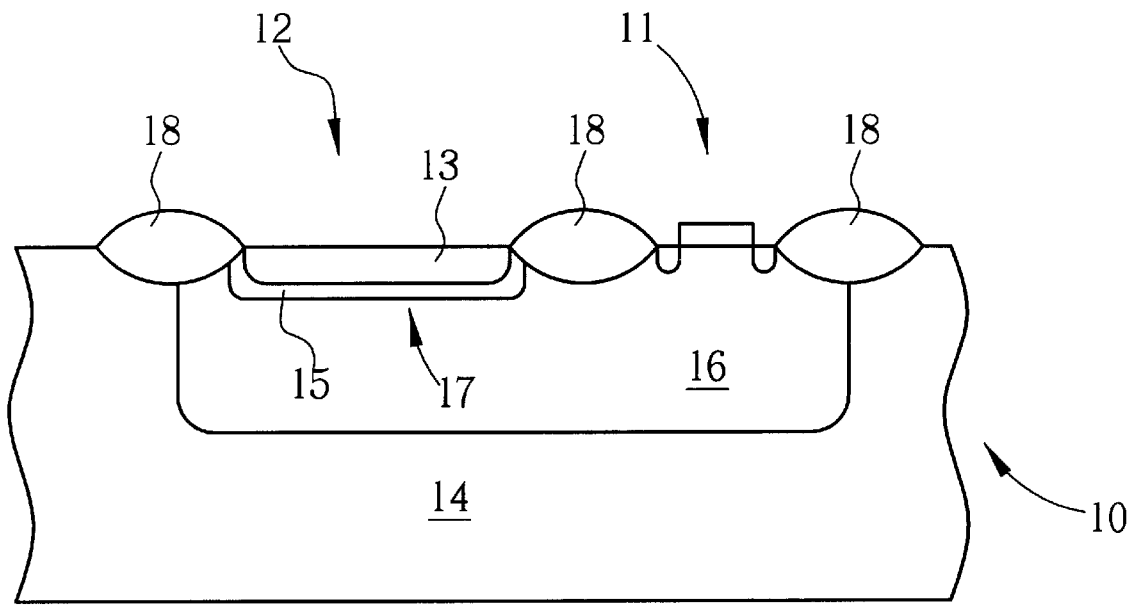
FIG. 1 is a schematic diagram of a photo diode according to the prior art.
Figure 2:
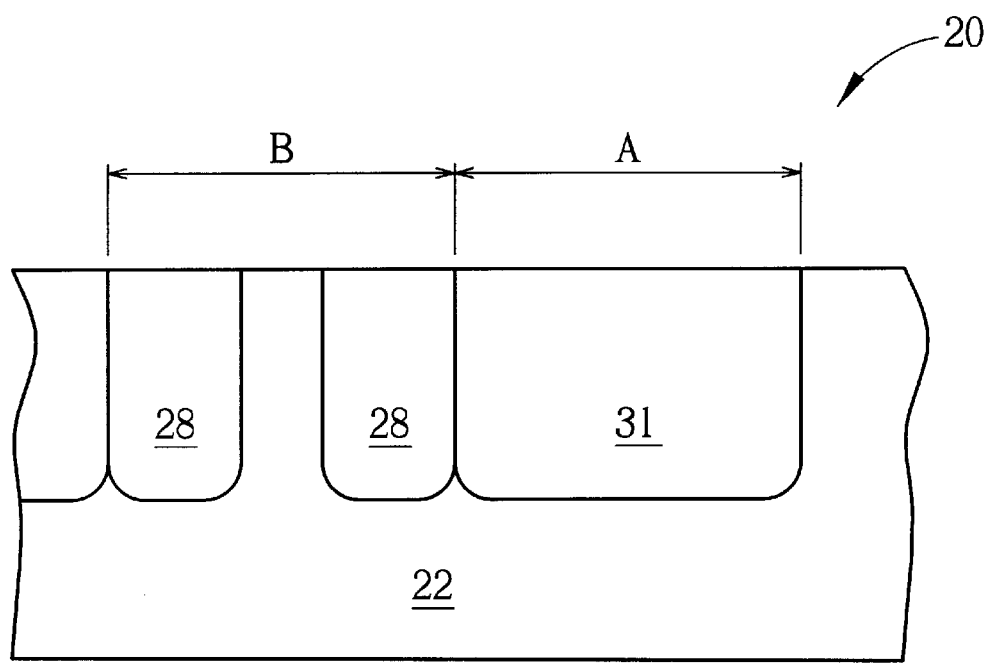
FIG. 2 though FIG. 5 are schematic diagrams of a method for forming a photo diode according to the present invention.

Please refer to FIG. 2 through FIG. 5, FIG. 2 through FIG. 5 are schematic diagrams of a method for forming a photo diode 50 according to the present invention. The present invention is a method of simultaneously forming a photo diode 50 and a CMOS transistor on a semiconductor wafer 20. The photo diode 50 is made on the surface of the semiconductor wafer 20. The semiconductor wafer 20 comprises a P-type substrate 22 on its surface. The surface of the P-type substrate 22 comprises a N-channel MOS area for forming a NMOS transistor of the CMOS transistor, a P-channel MOS area (not shown) for forming a PMOS transistor of the CMOS transistor, and a photo sensing area for forming the photo diode 50. As shown in FIG. 2, the area labelled by the capital letter A is the N-channel MOS area, and the area labelled by the capital letter B is the photo sensing area on the surface of the P-type substrate 22.

The P-type substrate 22 comprises a heavily doped P-type silicon substrate layer and a lightly doped epitaxy layer on the P-type silicon substrate layer. The epitaxy layer and the P-type silicon substrate layer are stacked. The photo diode 50 and the CMOS transistor are all formed in a surface layer of the epitaxy layer. The P-type substrate 22 may be a uniform P-type silicon material.

Figure 3:
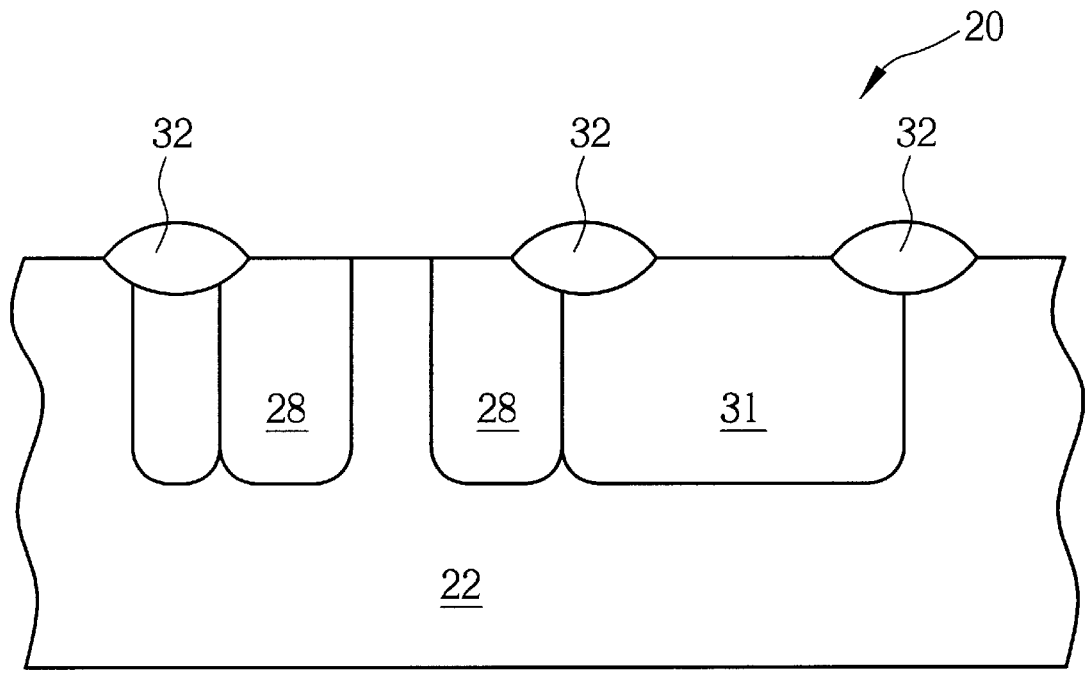

As shown in FIG. 2, the method for forming the photo diode 50 according to the present invention starts with a first ion implantation process on the semiconductor wafer 20 to form a P-type well 31 in the NMOS area A on the surface of the P-type substrate 22. Then, a second ion implantation process is performed to implant phosphorus atoms ($P^{31}$) into the surface of the P-type substrate 22 to form a first N-type doped area 28 in at least one predetermined area on the surface of the photo sensing area B. The concentration of the phosphorus atoms in the N-type doped area 28 formed by the second ion implantation process is about $10^{13}$ ion/cm$^2$. The second ion implantation process also forms an N-type well of the PMOS transistor in the PMOS area. Then, as shown in FIG. 3, a field oxide 32 is formed on the semiconductor wafer 20 for electrical isolation to prevent short circuits.

Figure 4:
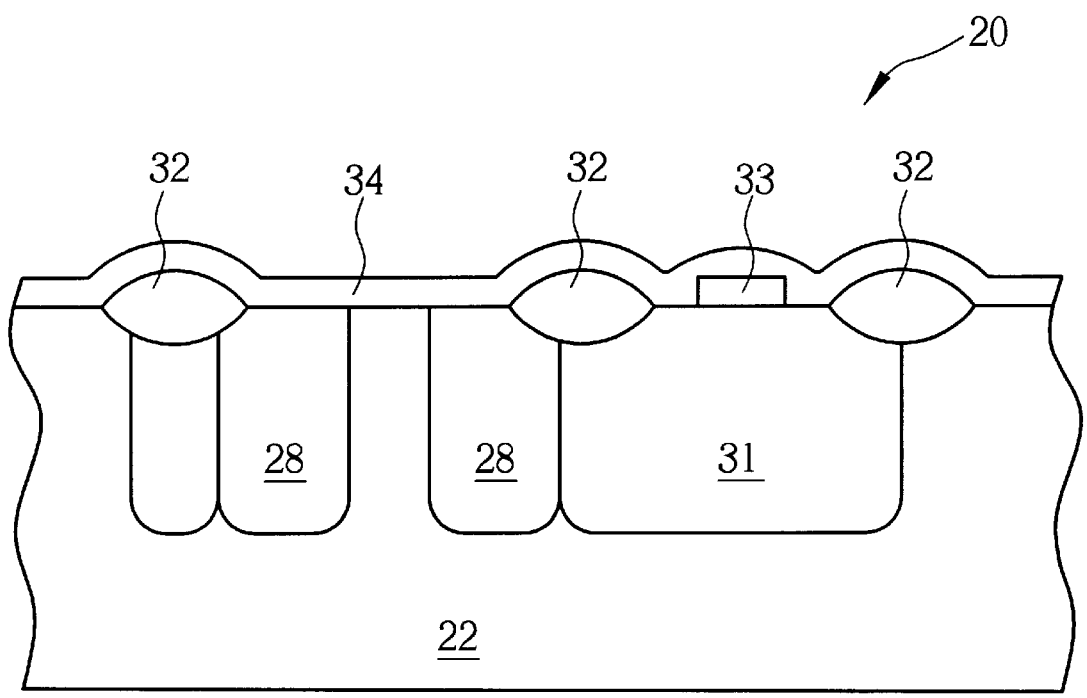

As shown in FIG. 4, after forming the filed oxide 32, a gate 33 of the NMOS transistor and a gate (not shown) of the PMOS transistor are formed. Next, another ion implantation is proceeded on the semiconductor wafer 20 to form lightly doped drain (LDD) of the NMOS transistor on the surface of the P-type well 31. Then, an atmospheric pressure chemical vapor deposition (APCVD) process introducing $O_3$ and TEOS gases to react at 100~400° C. is performed to form an $O_3$/TEOS oxide layer 34 on the semiconductor wafer 20.

Figure 5:
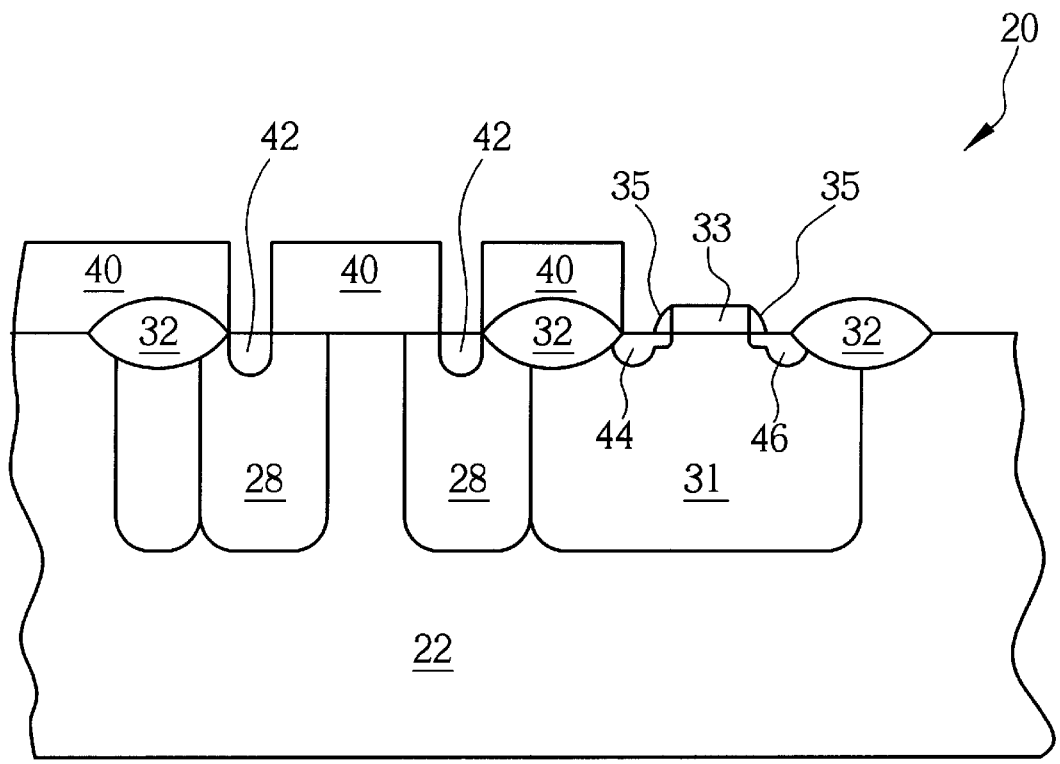

Finally, as shown in FIG. 5, an etching process to etch back the $O_3$/TEOS oxide layer 34 is performed to form a spacer 35 around the sidewall of the gate 33 of the NMOS transistor. Then, a lithography process is performed to form a photoresist layer 40 with a predetermined pattern to play as a mask on the semiconductor wafer 20. Then, a third ion implantation process is performed to implant As atoms into the surface of the P-type substrate 22 to form a second N-type doped area 42 with a shallow depth in part of the photo sensing area B to complete the photo diode 50. The second N-type doped area 42 partially overlaps the first N-type doped area 28, and is used as a conducting wire for connecting the photo sensing area B. Besides, the third ion implantation process is also performed to simultaneously form a source 44 and a drain 46 of the NMOS transistor in the P-type well 31.

Figure 6:
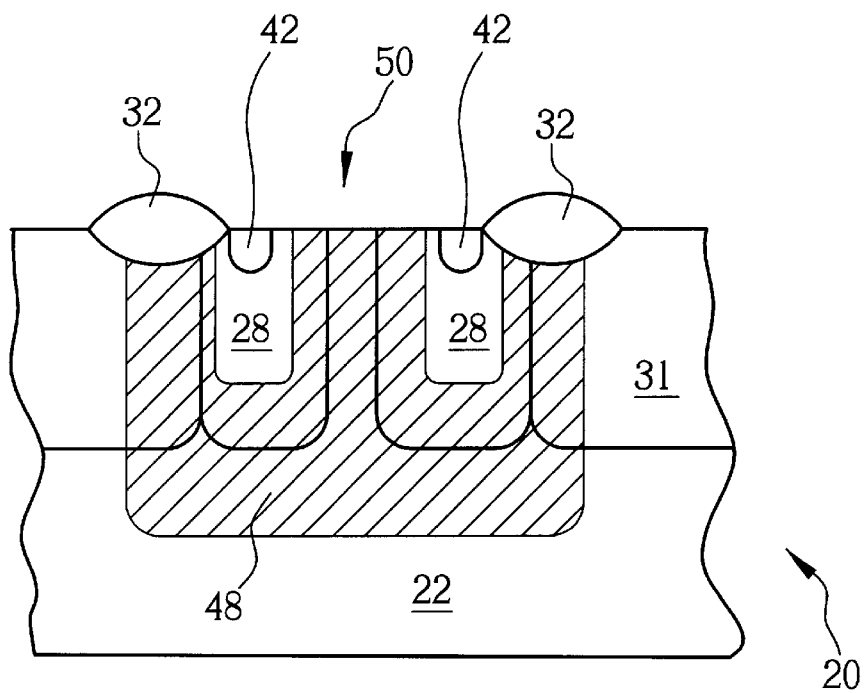
FIG. 6 is a schematic diagram of the photo diode according to the present invention.

Please refer to FIG. 6, FIG. 6 is a schematic diagram of the photo diode 50 according to the present invention. The photo diode 50 is formed on the surface of the P-type substrate 22 of the semiconductor wafer 20, and is surrounded by the field oxide 32 to electrically isolated from other semiconductor devices to prevent short circuits. The photo diode 50 comprises the first N-type doped area 36 with a shallow depth and a lower dosage, the second N-type doped area 40 with a deep depth and a higher dosage, and a depletion region 48 formed along the PN junction between the first N-type doped areas 28 and the P-type substrate 22. As shown in FIG. 6, the region labelled by slanting lines illustrates the depletion region 48.

Because the first N-type doped area 28 is formed in the predetermined area on the surface of the photo sensing area B, and the concentration of the phosphorus atoms in the N-type doped area is less than $10^{13}$ ion/cm$^2$. Thus, the dopants in the first N-type doped area 28 will interact with the neighboring P-type substrate 22 to form a wider deple-tion region 48 which fills the P-type substrate 22 in the photo sensing area but outside the predetermined area. Thus, the surface of the photo sensing area is completely covered by the N-type doped area 28 and the depletion region 48. According to the present invention, when the major light source is red light, a large proportion of light is sensed by the partial depletion region overlapping the first N-doped area. And when the major light source is the short wavelength light with a shallow penetration depth, such as blue light, the light is sensed by the partial depletion region outside the first N-type doped area. Therefore, the sensitivity of the photo sensing area for detecting lights of all wavelengths can be enhanced.

In addition, in the present invention, the third ion implantation process using As atoms at a high dosage as the major dopant will form the second N-type area with a high dosage on the surface of the first N-type doped area. The second N-type area serves as a conducting wire to connect the sensing areas to send the light current induced by the depletion region to other devices on the semiconductor wafer. It is quite different from the prior art photo diode in which the photo sensing area is formed by only one ion implantation process with a high dosage. Therefore, the present invention can effectively prevent the damage on the crystal structure on the surface of the photo sensing area, and increase the width of the depletion region to expend the real active region of the photo sensing area. As a result, the present invention enhances the intensity of the light current and increases the signal to noise ratio of the photo diode.

In contrast to the prior art method for forming the photo diode, the method according to the present invention forms the photo diode and the CMOS transistor on the semiconductor wafer simultaneouslyto simplify the fabrication processes and reduce the processing costs. The photo diode according to the present invention changes the layout pattern of the sensing area so that the surface of the photo sensing area is completely covered by the N-type doped area and the depletion region. It will enhance the sensitivity of the photo diode for detecting the short wavelength light, and prevents the damages of the crystal structure on the surface of the photo sensing area.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of simultaneously forming a photo diode and a CMOS transistor on a semiconductor wafer, the semiconductor wafer comprising a P-type substrate on its surface, and the surface of the P-type substrate comprises at least one N-channel MOS area for forming an NMOS transistor of the CMOS transistor, a P-channel MOS area for forming a PMOS transistor of the CMOS transistor, and a photo sensing area for forming a photo diode, the method comprising the following steps:

performing a first ion implantation process to form a P-type well of the NMOS transistor in the NMOS area; and performing a second ion implantation process to form a first N-type doped area in at least one predetermined area on the surface of the photo sensing area and also to form a N-type well of the PMOS transistor in the PMOS area;

wherein the dopants in the first N-type doped area interact with the neighboring P-type substrate to form a depletion region which fills the P-type substrate within the photo sensing area but outside the predetermined area so that the surface of the photo sensing area is completely covered by the first N-type doped area and the depletion region, and the depletion region formed on the surface of the photo sensing area is used to enhance the sensitivity of the photo diode to blue light.

2. The method of claim 1 further comprising the following step:

performing a third ion implantation process to form the source and drain of the NMOS in the P-type well of the NMOS area and to form a second N-type doped area simultaneously in part of the first N-type doped area of the photo sensing area which is used as a conducting wire for connecting the photo sensing area.

3. The method of claim 2 wherein a P-type well is also formed on the surface of the P-type substrate of the photo sensing area during the first ion implantation process and the first and second N-type doped areas are both formed on the surface of the P-type well of the photo sensing area.

4. The method of claim 2 wherein another ion implantation process is performed before performing the third ion implantation process to form a lightly doped drain (LDD) of the NMOS transistor.

5. The method of claim 1 wherein the second ion implantation process implants phosphorus atoms ($P^{31}$) into the semiconductor wafer.

6. The method of claim 5 wherein the concentration of the phosphorus atoms in the N-type doped area formed by the second ion implantation process is about $10^{13}$ ion/cm$^2$.

7. The method of claim 1 wherein the third ion implantation process implants arsenic atoms (As) into the semiconductor wafer.

8. The method of claim 1 wherein the P-type substrate comprises a heavily doped P-type silicon substrate and a lightly doped epitaxy layer on the surface of the P-type silicon substrate and wherein the photo diode and the CMOS transistor are formed in a surface layer of the epitaxy layer.

* * * * *